United States Patent [19]

Fukunaga

[11] Patent Number: 5,219,766

[45] Date of Patent: Jun. 15, 1993

[54] SEMICONDUCTOR DEVICE HAVING A RADIATION RESISTANCE AND METHOD FOR MANUFACTURING SAME

[75] Inventor: Hiroyuki Fukunaga, Tokyo, Japan

[73] Assignee: Oki Electric Industry Co., Ltd., Tokyo, Japan

[21] Appl. No.: 831,647

[22] Filed: Feb. 7, 1992

Related U.S. Application Data

[63] Continuation of Ser. No. 674,205, Mar. 25, 1991, abandoned.

[30] Foreign Application Priority Data

Apr. 25, 1990 [JP] Japan .................................. 2-107351

[51] Int. Cl.$^5$ .......................................... H01L 21/76
[52] U.S. Cl. .......................................... 437/24; 437/37; 437/61; 437/69; 437/228; 437/235; 437/238; 437/243; 437/978; 437/983
[58] Field of Search ................ 437/24, 26, 37, 61, 437/69, 228, 235, 243, 978, 983; 148/DIG. 82, DIG. 85, DIG. 86

[56] References Cited

U.S. PATENT DOCUMENTS 4,956,307  9/1990  Pollack et al. ...................... 437/938

FOREIGN PATENT DOCUMENTS 57-42153   3/1982  Japan .................................. 437/938
1-183137   7/1989  Japan .................................. 437/938

Primary Examiner—George Fourson
Attorney, Agent, or Firm—Spencer, Frank & Schneider

[57] ABSTRACT

A semiconductor device having a field insulating film which comprises a semiconductor substrate having an active region and a field region, a first oxide film formed on a surface of the substrate within the field region and etched on an upper surface of the first oxide film, an amorphous silicon layer formed on the surface of the first oxide film by ion implantation, and a second oxide film formed on the amorphous silicon layer whereby a field insulating film has a three-layered structure consisting of the first oxide film, the amorphous silicon layer and the second oxide film. A method for manufacturing the semiconductor device is also described.

10 Claims, 3 Drawing Sheets

SEMICONDUCTOR DEVICE HAVING A RADIATION RESISTANCE AND METHOD FOR MANUFACTURING SAME

This application is a continuation of application Ser. No. 07/674,205, filed Mar. 25th, 1991, now abandoned.

REFERENCE TO RELATED APPLICATION

This application claims the right of priority under 35 U.S.C. 119 of Japanese Application Serial No. 107351/1990, filed on Apr. 25, 1990, the entire disclosure of which is incorporated herein by reference.

BACKGROUND OF THE INVENTION

1. Field of the Invention

This invention relates to a semiconductor device having a high radiation resistance and a method for fabricating the same and more particularly, to such a semiconductor device and its manufacturing method wherein an insulating film in a field region is improved.

2. Description of the Related Art

In recent years, there is an increasing tendency toward the use of semiconductor integrated circuits in space and around nuclear reactors. The semiconductor integrated circuits placed under such severe conditions usually undergo various radiation damage by exposure to ionizing radiation such as X-rays, γ-rays and the like, with the possibility of causing malfunction and breakage of the circuits, thus leading to a lowering of the function of the system. In particular, the characteristic degradation is considered to result from positive charges generated in a field oxide film. In order to solve this degradation problem, three semiconductor devices have been heretofore proposed.

One of the semiconductor devices includes, as shown in FIG. 2, a thick oxide film 1 formed in a field region so as to separate the respective elements from one another, a highly concentrated impurity region 2 formed beneath the oxide film 1, a polycrystalline semiconductor layer 3 covered with the thick oxide layer at side and bottom faces thereof, and an electrode 4 electrically connected to the polycrystalline semiconductor layer 3. When a negative potential is applied to the electrode 4, the degradation by exposure to radiation can be reduced.

As another example, there has been proposed a semiconductor device having a field insulating film incorporated with a conductor such as of Al. In this semiconductor device, a negative potential is applied to the conductor as in the first device, whereby the degradation by exposure to radiation is reduced.

A semiconductor device of a further example is one which includes, as shown in FIG. 3, a conductive impurity-doped field insulating film 111 and a conductive layer 112 formed on the film 111. In this instance, a negative potential is applied to the conductive layer 112, as in the above-described devices, thereby reducing the degradation owing to damages caused by radiation. By this measure, the generation of a threshold or leakage voltage can be suppressed.

However, these semiconductor devices have, respectively the problem that it is very difficult to fabricate such devices in view of the actuality of the fabrication methods.

SUMMARY OF THE INVENTION

It is accordingly an object of the invention to provide a semiconductor device which is resistant to radiation and can be manufactured relatively simply.

It is another object of the invention to provide a method for manufacturing a semiconductor device whose field region has a good radiation resistance.

According to the invention, there is provided a semiconductor device having a field insulating film which comprises:

(a) a semiconductor substrate having an active region and a field region;

(b) a first oxide film formed on a surface of the substrate within the field region and etched on an upper surface of the first oxide film;

(c) an amorphous silicon layer formed on the surface of the first oxide film by ion implantation; and (d) a second oxide film formed on the amorphous silicon layer thereby forming a field insulating film having a three-layered structure consisting of the first oxide film, the amorphous silicon layer and the second oxide film.

There is also provided a method for manufacturing a semiconductor device according to the invention, which comprises the steps of;

(a) selectively forming a field oxide film on a surface of a semiconductor substrate and partly etching the field oxide film on the surface thereof;

(b) subjecting the etched surface of the field oxide film to ion implantation of silicon to form an amorphous silicon layer; and (c) forming an additional field oxide film on the amorphous silicon layer, to thereby form a field region having a three-layered structure of the oxide film, the amorphous silicon layer and the additional oxide film.

The additional oxide film may be formed by oxidation of the amorphous silicon layer or by a deposition process.

According to the semiconductor device of the invention, the amorphous silicon layer of the three-layered structure in the field region catches up holes generated by irradiation of radiation to extinguish them by recombination with electrons. Further, the holes generated by exposure to radiation is taken up with a crystal structure which has been formed, owing to the etching damage, on the etched surface of the field oxide film by the partial etching of the field oxide film surface. As a result, the holes are re-combined with electrons and become extinguished. Thus, the semiconductor device of the invention makes it possible to reduce positive charges accumulated in the field region, so that a satisfactory radiation resistance in the field is ensured.

According to the manufacturing method of the invention, after the formation of the field oxide film, the etching of the film surface, the ion implantation of physically, reliably stable oxidizable silicon and reoxidation are peformed. Thus, a semiconductor device having a good radiation-resistant effect can be manufactured by a relatively simple procedure.

BRIEF DESCRIPTION OF THE DRAWINGS

These and other features and advantages of the invention will be further understood from the following detailed description of the preferred embodiment with reference to the accompanying drawings, in which.

DETAILED DESCRIPTION OF THE PREFERRED EMBODIMENT

Figure 1A:
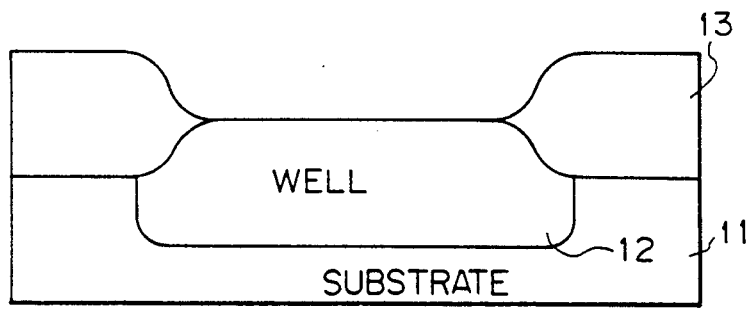
FIGS. 1(a) to 1(g) are, respectively, schematic sectional views of a manufacturing sequence of a semiconductor device according to an embodiment of the invention.

Referring to the drawings, a method of manufacturing semiconductor devices according to the present invention is explained with reference to FIGS. 1(a) to 1(g).

Each of the measurements, shapes and arrangements of the preferred embodiment described herein are illustrative and not restrictive, the scope of the invention being indicated by the appended claims and all versions which come within the meaning of the claims are intended to be embraced therein.

Referring now to FIGS. 1(a)–1(g) of the drawings, wherein like reference characters designate like or corresponding parts throughout the several views, there is shown an embodiment of the invention.

In this embodiment, a well layer 12 is formed on a silicon substrate 11 in a usual manner as shown in FIG. 1(a). Thereafter, according to a selective oxidation technique (LOCOS method) using a nitride film mask, a field oxide film 13 is selectively formed on the surface of the substrate 11 in a thickness of about 6000 to 8000 angstroms.

Figure 1B:
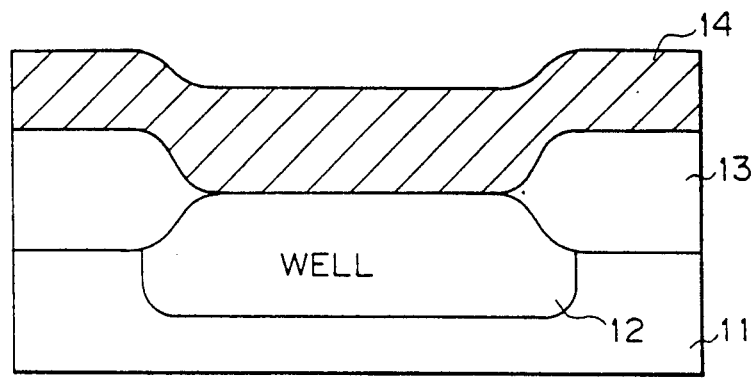

Then, as shown in FIG. 1(b), a resist or LP-SiO$_2$ film 14, which serves as a buffer layer when the field oxide film 13 is etched back to some extent, is coated or formed entirely on the substrate 11 by a LPCVD method in a thickness of 1000 to 1500 angstroms.

Figure 1C:
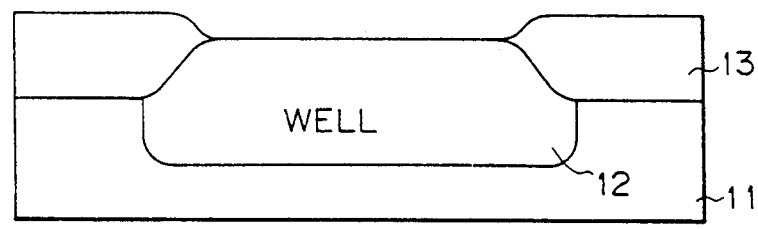

Thereafter, the resist or LP-SiO$_2$ film 14 is etched back by ordinary dry etching. At the same time, the surface of the field oxide 13 which is exposed during the course of the dry etching is etched back to 1000 to 2000 angstroms as shown in FIG. 1(c).

Figure 1D:
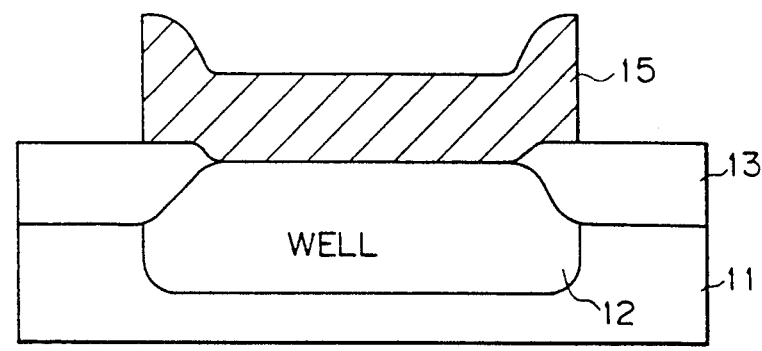
Figure 1E:
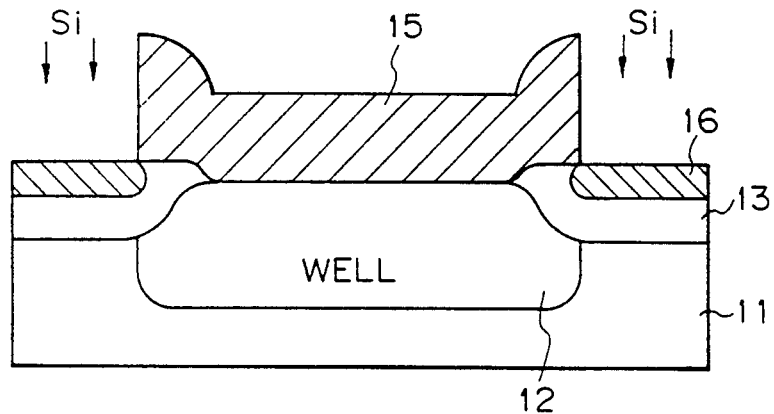
Figure 1F:
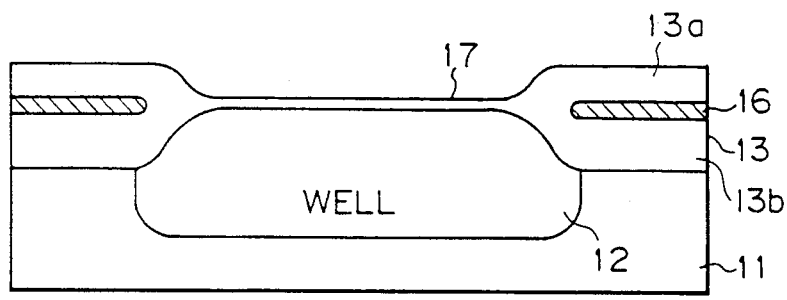

Subsequently, a resist pattern 15 is formed on the well layer 12 as shown in FIG. 1(d). This resist pattern 15 should have a thickness such that subsequent ion implantation of silicon does not influence the well layer 12 (active region).

Next, the ion implantation of silicon is effected on the surface of the field oxide film 13 using the resist pattern 15 as a mask. This is particularly shown in FIG. 1(e). As a result, an amorphous silicon layer 16 is formed. At the time, care should be taken so that the ion implantation is carried out at an energy as low as possible (e.g. at an acceleration voltage of not higher than 200 KeV) in order that the silicon is not implanted to a depth greater than necessary. The dose of the silicon is in the range of from $1 \times 10^{10}$ to $1 \times 10^{20}$ ions/cm$^2$.

The resist pattern 15 is removed and, after sufficient washing, a gate oxide film 17 is formed on the surface of the well layer 12 in a thickness of from 100 to 200 angstroms by thermal oxidation (in an atmosphere which may be either wet or dry) at temperatures of not higher than 900° C. At the same time, part of the amorphous silicon layer 16 is also oxidized, by which the field oxide film 13a is additionally formed. As a result, the field oxide 13 has a three-layered structure which consists of the oxide film 13a, the amorphous silicon layer 16 and the oxide film 13b.

Figure 1G:
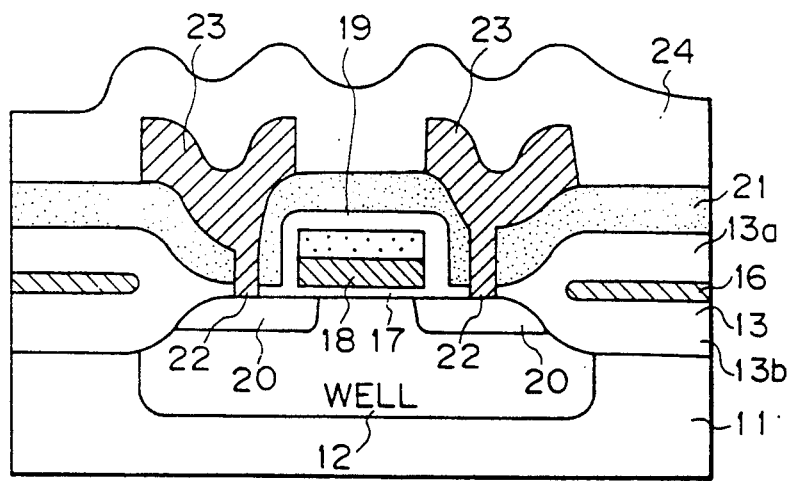
Figure 2:
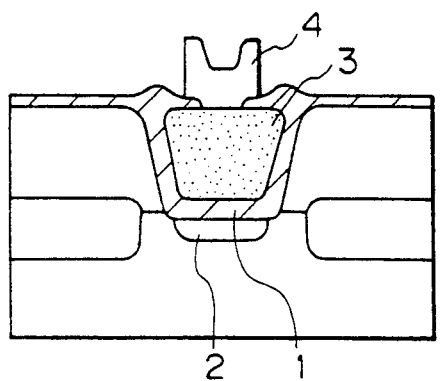
FIGS. 2 and 3 are, respectively, schematic sectional views of semiconductor devices of the related art.
Figure 3:
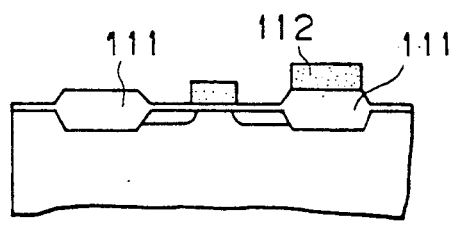

Then, as shown in FIG. 1(g), a gate electrode 18 of polysilicon or polycide is formed on a gate oxide film 17. Moreover, a mask oxide film 19 is formed on the gate electrode 18 and also on the surface of the well layer 12 at opposite sides of the gate electrode 18 by annealing at not higher than 900° C. in an O$_2$ gas. Source/drain regions 20 are formed within the well layer 12 at opposite sides of the gate electrode 18, followed by coverage of the entire surface with an intermediate insulating film 21. The film 21 is provided with contact holes 22 for the source/drain region 20 and Al wirings or contact 23 are formed as shown. Finally, a passivation film 24 is formed over the entire surface to complete a semiconductor device.

It will be noted that the oxide film 13a formed on the amorphous silicon 16 may be formed by a step different from the formation of the gate oxide film 17. In the case, the oxide film 13a may be formed by a chemical vapor deposition (CVD) process. When the oxide film 13a is formed by a different process step, the thickness of the oxide film 13a can conveniently be selected arbitrarily irrespectively of the thickness of gate oxide film 17.

In the manufacturing method of the invention, after the etching back of the original field oxide film 13 and the ion implantation of silicon, a number of thermal treatment procedures are necessary (e.g. thermal oxidation carried out to form the oxide films 17, 19, flow and contact flow of the intermediate insulating film 21, and the like). These procedures should all be effected at temperatures of not higher than 900° C. so that the radiation resistance-improving effect is not impeded. If the thermal treatments are performed over 900° C., the etching damage is restored with a loss of the hole catch-up effect. In addition, the silicon is diffused, so that the effect of extinguishing holes by re-combination in the amorphous silicon layer 16 is lowered. Thus, the radiation resistance is not improved significantly.

As described in detail, the semiconductor device of the invention can enhance the radiation resistance in the field region with the possibility of manufacturing a highly reliable device. Moreover, according to the manufacturing method of the invention, the semiconductor device can be made very simply by formation of a field oxide film, etching of the film surface, ion implantation of physically, reliably stable, oxidizable silicon and re-oxidation. Accordingly, the manufacture process of the invention can be readily incorporated in an existing manufacture line.

What is claimed is:

1. A method for manufacturing a semiconductor device, which comprises the steps of:
    (a) selectively forming a filed oxide film on a surface of a semiconductor substrate and partly etching the field oxide film on the surface thereof;
    (b) subjecting the etched surface of the field oxide film to ion implantation of silicon to form an amorphous silicon layer; and
    (c) forming an additional field oxide film on the amorphous silicon layer thereby forming a filed region having a three-layered structure of the oxide film, the amorphous silicon layer and the additional field oxide film.

2. A method for manufacturing a semiconductor device, which comprises the steps of:
    (a) selectively forming a first thermal oxidation film on a surface of a semiconductor substrate in a field region and etching said first thermal oxidation film on the surface thereof by dry etching;
    (b) subjecting the etched surface of said first thermal oxidation film to ion implantation of silicon to form an amorphous silicon layer on the surface of said first thermal oxidation film; and (c) forming a gate oxide film of an active element on an active region of the substrate and forming a second oxide film on said first thermal oxidation film and said amorphous silicon layer.

3. The method according to claim 2, wherein said second oxide film is formed by thermal treatment.

4. The method according to claim 1 wherein said additional field oxide film is formed by oxidation of the amorphous silicon layer.

5. The method according to claim 4 wherein said oxidation of the amorphous silicon layer is carried out at a temperature not higher than 900° C.

6. The method according to claim 1 wherein said additional field oxide film is formed by a chemical vapor deposition process.

7. The method according to claim 2 wherein said substrate is a silicon substrate and said gate oxide film and said second oxide film are simultaneously formed by thermal oxidation of said active region of said substrate and of said amorphous silicon layer, respectively.

8. The method according to claim 7 wherein the thermal oxidation is carried out at a temperature not higher than 900° C.

9. The method according to claim 7 further comprising forming an active device in said active region of said substrate; and carrying out all thermal treatments after said step (b) at temperatures not higher than 900° C.

10. The method according to claim 2 wherein said substrate is a silicon substrate; said gate oxide film is formed by thermal oxidation of said substrate in said active region at a temperature not higher than 900° C.; and said second oxide film is deposited on said amorphous silicon layer at a temperature not higher than 900° C.

* * * * *